(12) United States Patent
Gong et al.

(10) Patent No.: US 11,688,457 B2
(45) Date of Patent: Jun. 27, 2023

(54) USING FERROELECTRIC FIELD-EFFECT TRANSISTORS (FEFETS) AS CAPACITIVE PROCESSING UNITS FOR IN-MEMORY COMPUTING

(71) Applicant: International Business Machines Corporation, Armonk, NY (US)

(72) Inventors: Nanbo Gong, White Plains, NY (US); Guy M. Cohen, Ossining, NY (US); Takashi Ando, Eastchester, NY (US); Yulong Li, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/134,292

(22) Filed: Dec. 26, 2020

(65) Prior Publication Data

US 2022/0208259 A1 Jun. 30, 2022

(51) Int. Cl.
| | | |
|---|---|---|
| *G11C 11/22* | (2006.01) | |
| *G11C 11/54* | (2006.01) | |
| *G06N 3/08* | (2023.01) | |
| *G06N 3/065* | (2023.01) | |
| *H10B 53/30* | (2023.01) | |
| *H10B 53/40* | (2023.01) | |

(52) U.S. Cl.
CPC .............. *G11C 11/54* (2013.01); *G06N 3/065* (2023.01); *G06N 3/08* (2013.01); *G11C 11/221* (2013.01); *H10B 53/30* (2023.02); *H10B 53/40* (2023.02)

(58) Field of Classification Search
CPC . G11C 11/54; G11C 11/221; H01L 27/11507; H01L 27/11509; G06N 3/0635; G06N 3/08

USPC .......................................................... 365/145
See application file for complete search history.

(56) References Cited

U.S. PATENT DOCUMENTS

| | | | |
|---|---|---|---|
| 9,281,044 B2 | 3/2016 | Ramaswamy et al. | |
| 9,514,816 B1 * | 12/2016 | Ashokkumar | G11C 14/0072 |
| 10,074,422 B1 | 9/2018 | Tandingan et al. | |
| 10,204,907 B2 * | 2/2019 | Leobandung | H01L 27/10844 |
| 10,319,818 B2 | 6/2019 | Frank et al. | |
| 10,381,074 B1 * | 8/2019 | Kim | G11C 13/003 |

(Continued)

OTHER PUBLICATIONS

Authorized Officer Lin,Fang, PRC National IP Administration as ISA, related PCT application PCT/CN2021/126822, ISR and Written Opinion, 10 pages total, dated Jan. 26, 2022.

(Continued)

*Primary Examiner* — Viet Q Nguyen
(74) *Attorney, Agent, or Firm* — Samuel Waldbaum; Otterstedt & Kammer PLLC (57) ABSTRACT

An electronic circuit includes a plurality of word lines; a plurality of bit lines intersecting said plurality of word lines at a plurality of grid points; and a plurality of in-memory processing cells located at said plurality of grid points. Each of said in-memory processing cells includes a first switch having a first terminal coupled to a corresponding one of said word lines and a second terminal; a second switch having a first terminal coupled to said second terminal of said first switch and a second terminal coupled to a corresponding one of said bit lines; and a non-volatile tunable capacitor having one electrode coupled to said second terminal of said first switch and said first terminal of said switch, and having another electrode coupled to ground.

3 Claims, 6 Drawing Sheets

(56) References Cited

U.S. PATENT DOCUMENTS

| | | | |
|---|---|---|---|
| 10,497,866 B1* | 12/2019 | Fuller | G11C 7/1006 |
| 10,529,402 B2 | 1/2020 | Kawamura et al. | |
| 11,239,824 B2* | 2/2022 | Fujii | H03H 9/21 |
| 2005/0135143 A1 | 6/2005 | Jeon | |
| 2016/0118404 A1 | 4/2016 | Peng | |
| 2018/0053832 A1 | 2/2018 | Beyer et al. | |
| 2019/0148890 A1* | 5/2019 | Zhao | H01R 13/6594 |
| | | | 439/83 |
| 2019/0311749 A1* | 10/2019 | Song | G11C 16/045 |
| 2020/0202202 A1 | 6/2020 | Chava et al. | |
| 2020/0258561 A1 | 8/2020 | DeVilbiss et al. | |
| 2021/0073619 A1* | 3/2021 | Wang | G06N 3/084 |
| 2021/0081775 A1* | 3/2021 | Leobandung | G06N 3/04 |
| 2021/0089865 A1* | 3/2021 | Wang | G06F 17/15 |
| 2021/0117500 A1* | 4/2021 | Qin | G11C 11/2273 |
| 2021/0202511 A1* | 7/2021 | Yeong | H01L 28/60 |
| 2021/0365241 A1* | 11/2021 | Huang | G11C 13/003 |
| 2021/0374546 A1* | 12/2021 | Tsai | G06F 17/16 |

OTHER PUBLICATIONS

Sun et al., Exploiting hybrid precision for training and inference: A 2T-1FeFET based analog synaptic weight cell, International Electron Devices Meeting (IEDM), 2018, 3.1, 4 pp.

Zheng et al., Artificial neural network based on doped HfO2 ferroelectric capacitors with multilevel characteristics, IEEE Electron Device Letters, vol. 40, No. 8, 2019, pp. 1309-1312.

K. Florent et al., "First demonstration of vertically stacked ferroelectric Al doped HfO2 devices for NAND applications," 2017 Symposium on VLSI Technology, Kyoto, 2017, pp. T158-T159, doi: 10.23919/VLSIT.2017.7998162.

N. Gong and T. Ma, "A Study of Endurance Issues in HfO2-Based Ferroelectric Field Effect Transistors: Charge Trapping and Trap Generation," in IEEE Electron Device Letters, vol. 39, No. 1, pp. 15-18, Jan. 2018, doi: 10.1109/LED.2017.2776263.

N. Gong et al., "Nucleation limited switching (NLS) model for HfO2-based metal-ferroelectric-metal (MFM) capacitors: Switching kinetics and retention characteristics" Appl. Phys. Lett. 112, 262903 (2018); https://doi.org/10.1063/1.5010207 5 Pages Plus Cover.

* cited by examiner

USING FERROELECTRIC FIELD-EFFECT TRANSISTORS (FEFETS) AS CAPACITIVE PROCESSING UNITS FOR IN-MEMORY COMPUTING

BACKGROUND

The present invention relates to the electrical, electronic, and computer arts, and more specifically, to electronic circuitry suitable for implementing neural networks and the like.

Neural networks have increased in popularity for a variety of applications. Neural networks are used to carry out machine learning. A computer learns to perform some task by analyzing training examples. Typically, the examples have been hand-labeled in advance by a human expert. A neural network includes thousands or even millions of simple processing nodes that are densely interconnected. Training of neural networks, and inference using trained neural networks, is computationally expensive.

Hardware-based techniques have been proposed to address the computational challenges associated with neural networks; for example, a two-transistor one FeFET (2T-1FeFET)-based analog synaptic weight cell has been proposed, as has use of Hafnium Dioxide ($HfO_2$) ferroelectric capacitors with multi-level characteristics. Co-assigned U.S. Pat. No. 10,204,907 to Leobandung et al. discloses metal-insulator-metal capacitor analog memory unit cell.

SUMMARY

Principles of the invention provide techniques for using ferroelectric field-effect transistors (FeFETs) as capacitive processing units for in-memory computing. In one aspect, an exemplary electronic circuit includes a plurality of word lines; a plurality of bit lines intersecting said plurality of word lines at a plurality of grid points; and a plurality of in-memory processing cells located at said plurality of grid points. Each of said in-memory processing cells includes: a first switch having a first terminal coupled to a corresponding one of said word lines and a second terminal; a second switch having a first terminal coupled to said second terminal of said first switch and a second terminal coupled to a corresponding one of said bit lines; and a non-volatile tunable capacitor having one electrode coupled to said second terminal of said first switch and said first terminal of said switch, and having another electrode coupled to ground.

In another aspect, an exemplary method includes charging a plurality of non-volatile tunable capacitors in a plurality of cells by turning on a plurality of first switches coupling first electrodes of said non-volatile tunable capacitors to a plurality of word lines maintained at a plurality of voltages corresponding to a voltage vector; subsequent to said charging, discharging said plurality of non-volatile tunable capacitors by turning on a plurality of second switches coupling said first electrodes of said non-volatile tunable capacitors to a plurality of bit lines; and, for each bit line of said plurality of bit lines, integrating a total charge of each of said plurality of non-volatile tunable capacitors associated with a given one of said bit lines with a corresponding plurality of integrators coupled to said plurality of bit lines.

In still another aspect, an in-memory processing cell, for interconnection with a word line, a bit line, and a ground terminal, includes a first switch having a first terminal for interconnection to the word line and a second terminal; a second switch having a first terminal coupled to said second terminal of said first switch and a second terminal for interconnection to the bit line; and a non-volatile tunable capacitor having one electrode coupled to said second terminal of said first switch and said first terminal of said switch, and having another electrode for interconnection to the ground terminal.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

These and other features and advantages of the present invention will become apparent from the following detailed description of illustrative embodiments thereof, which is to be read in connection with the accompanying drawings.

BRIEF DESCRIPTION OF THE DRAWINGS

FIG. 9 depicts a computer system that uses a coprocessor in accordance with aspects of the invention, suitable for accelerating neural network implementation, digital filter implementation, and the like.

DETAILED DESCRIPTION

Figure 2:
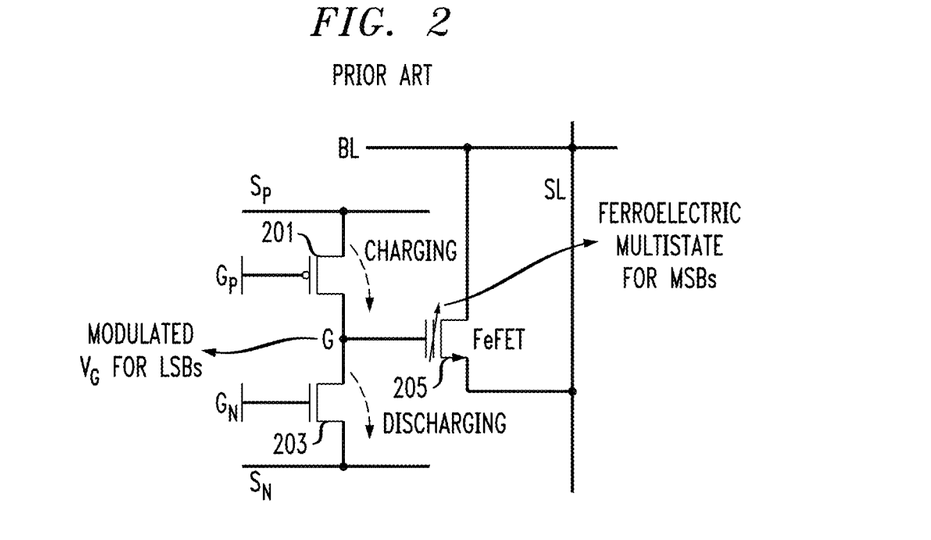

As noted, hardware-based techniques have been proposed to address the computational challenges associated with neural networks. For example, the aforementioned 2T-1FeFET-based analog synaptic weight cell is shown in FIG. 2. The cell includes a p-type field effect transistor (PFET) 201 with a gate labeled GP; an n-type field effect transistor (NFET) 203 with a gate labeled GN; and an FeFET 205 with a gate labeled G. As will be appreciated by the skilled artisan, "G" is also the symbol for electrical conductance; the skilled artisan will appreciate from the context whether the gate or the electrical conductance is being referred to by the symbol "G." A source terminal of PFET 201 is coupled to rail Sp (e.g., power supply rail at supply voltage Vdd); a drain terminal of PFET 201 is coupled to a drain terminal of NFET 203 and gate G of FeFET 205; and a source terminal of NFET 203 is coupled to rail SN (e.g., ground). A first drain-source terminal of FeFET 205 is coupled to bit line BL and a second drain-source terminal of FeFET 205 is coupled to source line SL.

Figure 1:
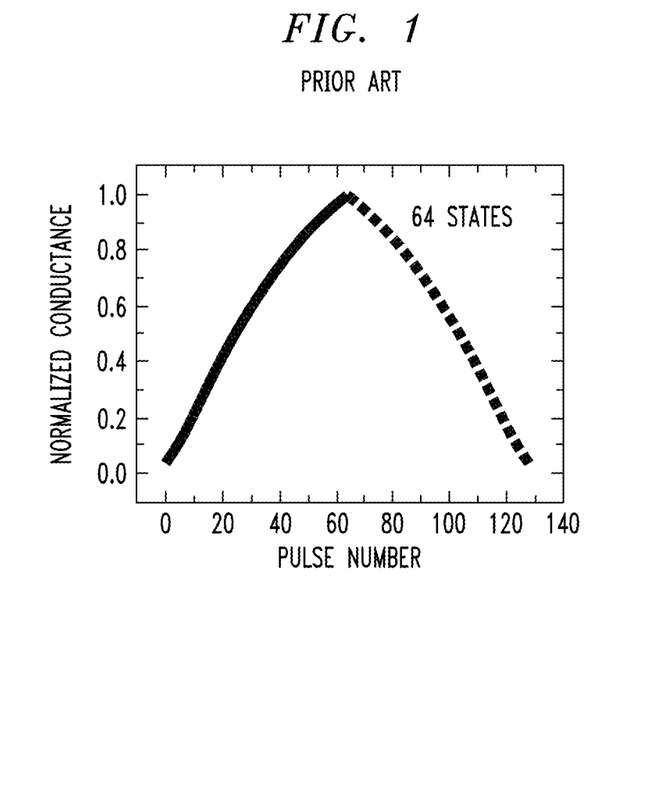
FIGS. 1 and 2 depict aspects of a 2T-1FeFET Based Analog Synaptic Weight Cell, according to the prior art.

The skilled artisan will appreciate that an FeFET is a type of field-effect transistor (FET) that includes a ferroelectric material sandwiched between the gate electrode and source-drain conduction region of the device (the channel). Polarization in the ferroelectric layer is switchable if the external electric field is greater than the coercive field of this ferroelectric material, and remains unchanged (Remnant polarization) in the absence of electrical bias. Because of the different polarization directions in the ferroelectric film, it modulates electrical statics of the FET and changes the capacitance of oxide stacks and current flows from drain to source. The FeFET gate capacitor functions as an analog memory for the least significant bits (LSBs). The corresponding pull-up PFET 201 and pull-down NFET 203 charge and discharge the FeFET gate capacitor. The LSBs of the neural network weight can accordingly be encoded to the channel conductance of the FeFET 205. To accomplish this, modulate the gate voltage ($V_G$) on gate G while keeping the FeFET 205 working in the triode region. The different FeFET polarization states are employed to encode the most significant bits (MSBs). Sixty-four different states can be encoded in the cell of FIG. 2, as shown in FIG. 1. The states to the left of the peak correspond to positive updates and the states to the right of the peak correspond to negative updates.

Furthermore, in this regard, in the prior art of FIGS. 1 and 2, channel conductance is used to store the weight information. Because an FeFET is employed, the channel conductance is affected by the gate stack, where the different polarization affects the gate capacitor, so that it affects the charge within the channel. Simply put, channel current relates to how many charges and how fast they can move. So, channel conductance is related to the gate capacitance. One pertinent difference between the prior art of FIGS. 1 and 2 and one or more embodiments is that the cell depicted in FIG. 2 employ FET conductance as a readout to extract the weight of the synapse, whereas one or more embodiments use capacitance of a capacitor, as will be discussed further below.

The cell shown in FIG. 2 requires both NMOS and PMOS devices. This requires additional fabrication adjustments since the FeFET 205 is either NMOS or PMOS. In contrast, one or more embodiments advantageously use only NMOS (or only PMOS) for both charge and discharge control capacitors (pull up and pull down). Furthermore, in the cell of FIG. 2, the conductance G of the FeFET is used to store weights and current still flows during read operations, causing power dissipation. In contrast, one or more embodiments advantageously use the capacitance of FeRAM (i.e., RAM or random-access memory using a ferroelectric layer such as that of capacitors 709, discussed below, instead of a dielectric layer to achieve non-volatility) to store the weight information (rather than using conductance of an FeFET). Unlike a resistor which is implemented by the conductance of the FeFET channel, an ideal capacitor does not dissipate energy.

Figure 3:
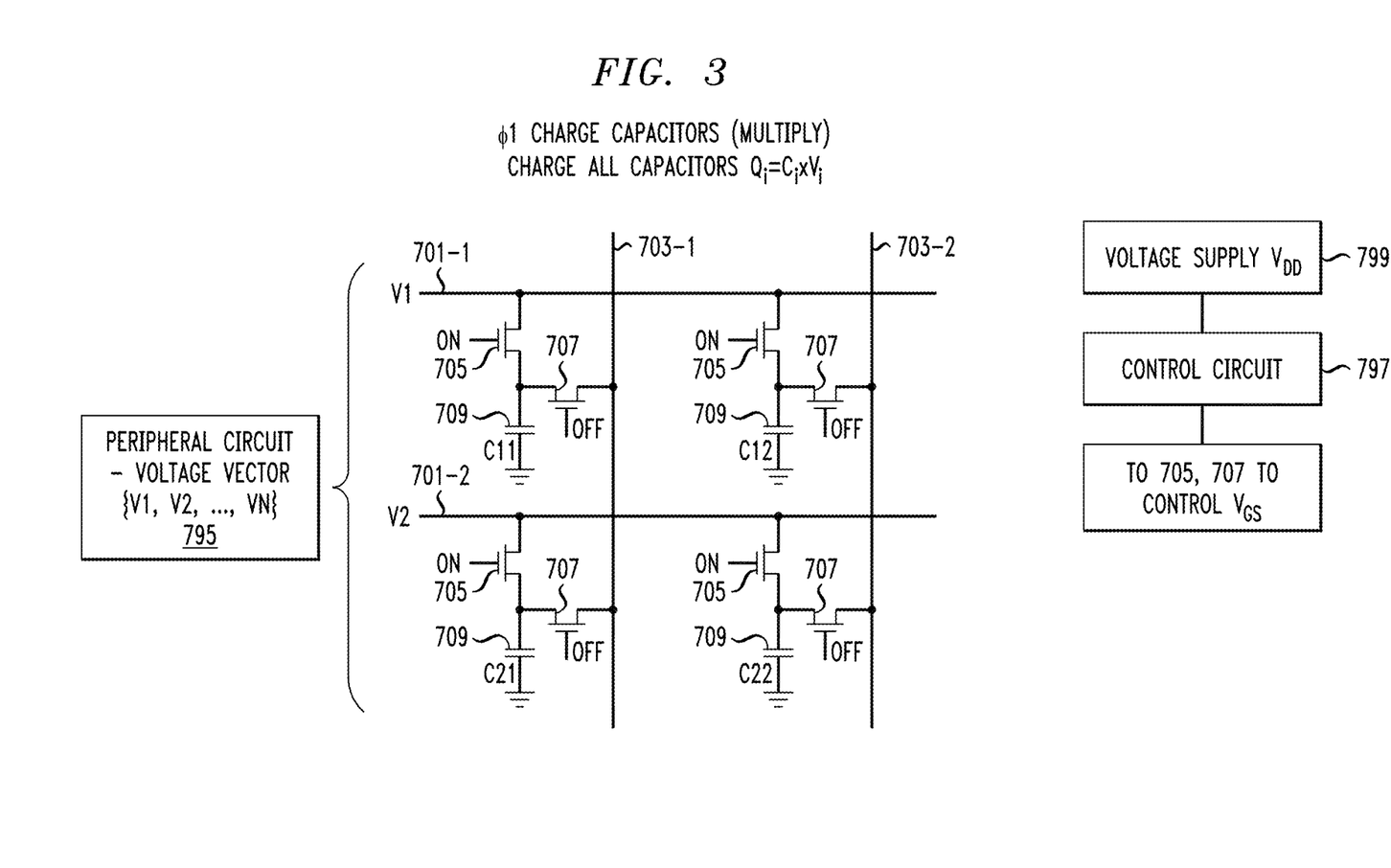
FIG. 3 shows an array of in-memory processing cells during a multiply phase, according to an aspect of the invention.

FIG. 3 shows an exemplary array architecture, during a charge process, according to an aspect of the invention. The array includes a plurality of word lines 701-1, 701-2 (only two are shown for brevity) and a plurality of bit lines 703-1, 703-2 (only two are shown for brevity). At each grid point (intersection of word line and bit line), a cell is located. Each cell includes a first field effect transistor 705 having a first drain-source terminal coupled to a corresponding one of the word lines and a second drain-source terminal. Each cell also includes a second field effect transistor 707 having a first drain-source terminal coupled to the second drain-source terminal of the first field effect transistor and a second drain-source terminal coupled to a corresponding one of the bit lines. Each cell still further includes a metal-ferroelectric-metal capacitor 709 having one plate coupled to the second drain-source terminal of the first field effect transistor and the first drain-source terminal of the second field effect transistor, and having another plate coupled to ground (it being understood that "ground" is relative to the applied voltage(s) and does not necessarily imply an actual grounding connection to the Earth (although such is possible).

Note that a plate capacitor is used here as an example; however, other geometries such as a trench capacitor can also be used. Trench capacitors are typically used for embedded DRAM due to the high density that can be achieved using this geometry. Capacitor 709 can be implemented using other geometries. As noted, the capacitor can be implemented as a trench capacitor. In this case, the geometry resembles a cylinder with the center core being one electrode and a shell around the core being the second electrode. The dielectric material between the two electrodes is the ferroelectric dielectric.

In the charge process shown in FIG. 3, the transistors 705 are ON, the transistors 707 are OFF, and the voltages V1, V2 on the word lines 701-1, 701-2 cause the capacitors to charge. The charge on the $i^{th}$ capacitor is $Q_i = C_i \times V_i$, where $C_1$ is the individual capacitance value and V1 is the voltage across the given capacitor.

Figure 4:
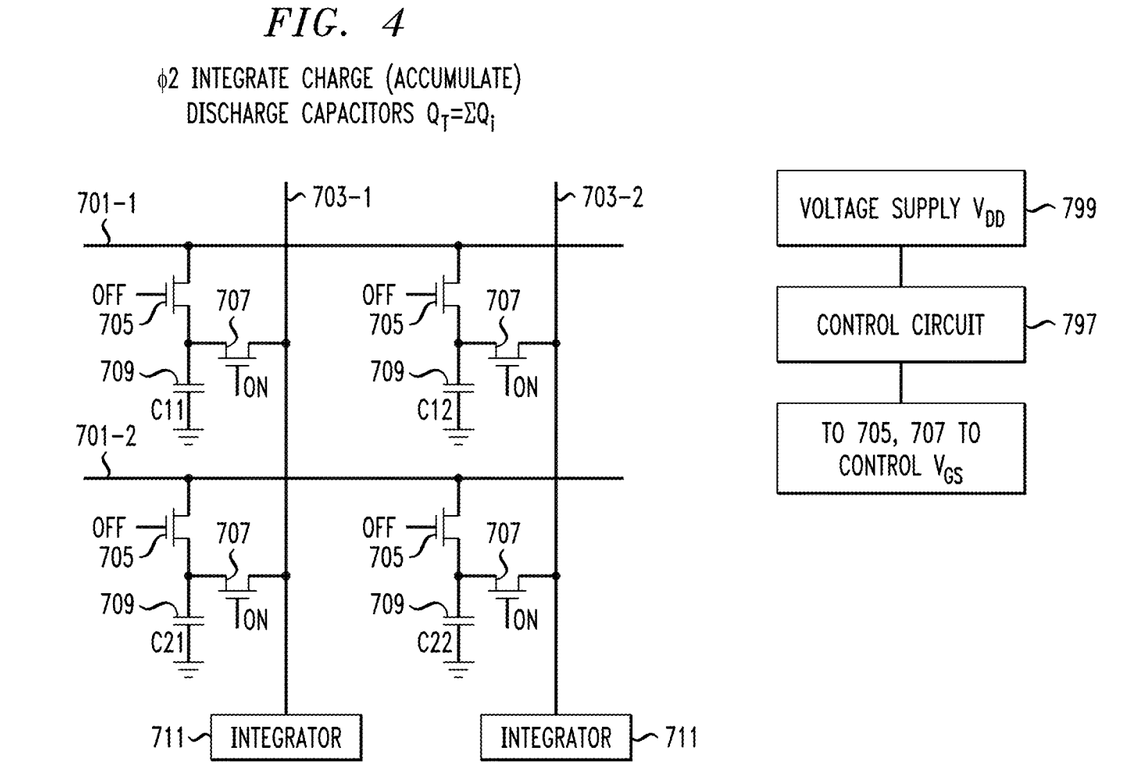
FIG. 4 shows the array of in-memory processing cells during an accumulate phase, according to an aspect of the invention.

FIG. 4 shows the exemplary array architecture of FIG. 3, during a process of discharging the capacitors (charge integration), according to an aspect of the invention. In the discharge/integration process shown in FIG. 4, the transistors 705 are OFF and the transistors 707 are ON. The capacitors 709 discharge through transistors 707 and bit lines 703-1, 703-2. Each bit line is coupled to an integrator 711. The total charge $Q_T$ discharged by the capacitors is given by $Q_T = \Sigma Q_i$ (i.e., the sum of the individual charges).

The processes shown in FIGS. 3 and 4 can be used during multiply-accumulate (MAC) operations in training a neural network. More specifically, the neural network weights, which are represented by the capacitance $C_i$, are multiplied by the input voltages $V_i$, and all the products $V_i \times C_i$, are summed. This MAC operation is not limited to neural networks, and is also used in matrix multiplication, and digital finite impulse response (FIR) filters.

Figure 5:
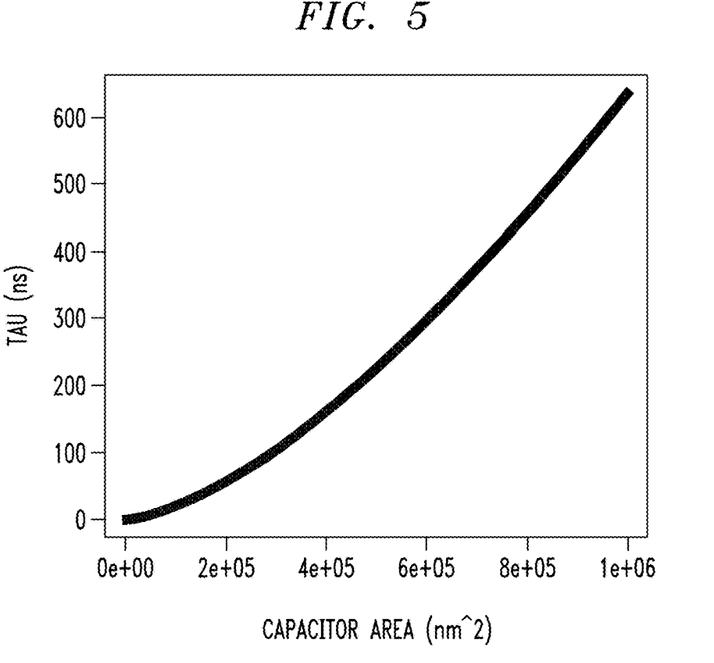
FIG. 5 presents a plot of time constant versus capacitor area, according to an aspect of the invention.

FIG. 5 shows the RC time constant, T, in nanoseconds (ns) versus the capacitor area in nm$^2$ for an exemplary embodiment of an array as shown in FIGS. 3 and 4, with exemplary dimensions/parameters of r=4.5 ohm/μm (resistance per unit length for 14 nm Low Power Plus (LPP) KX level metal), d=10 nm (capacitor plates separation), relative permittivity $\varepsilon_r$=20 (average level), and 4000 cells, τ=0.5*r_cell*c_cell*cells^2, where r_cell is the metal resistance/cell and c_cell is the FeFET capacitance/cell. Many suitable configurations of capacitors can be employed with one or more embodiments; e.g., parallel plate, cylindrical, trench, and the like. Capacitors should be able to hold the charge for an appropriate period of time, typically the time it takes to complete the MAC operation. This requirement is easily met even with leaky capacitors. In the prior art approach disclosed in co-assigned U.S. Pat. No. 10,204,907, the charge loaded onto the capacitor represented the neural network weights. As such the capacitor must hold the charge for a long period of time, or need to be refreshed periodically to compensate for leakage. One or more embodiments also include capacitors that are charged, but the neural network weight information is not stored in the charge put on the capacitor, but rather in the value of the capacitance. The value of the capacitance is stored in the ferroelectric polarization which is a nonvolatile property. Furthermore in this regard, capacitors in the prior art approach typically need to hold the charge for the entire time the neural network is used (as opposed to one MAC operation, as in one or more embodiments, which is typically a few tens of nanoseconds), but since such time may be very long (e.g., weeks or years depending on the application), and since capacitors will leak the charge on a time scale of a few seconds, the charge of the capacitors will need to be refreshed (e.g., every hundred milliseconds). Note that a refresh is practiced in DRAM memories, which also used capacitors to store data. However, in the prior art capacitive analog memory cell, the refresh process is more complicated than in a DRAM, since in a DRAM only two states are stored, "0" and "1," while in the particular prior art devices, it is necessary to restore, during refresh, the exact amount of charge which represents the weight to each capacitor.

Refer still to FIGS. 3 and 4, showing a MAC operation (multiply and accumulate) by charging the capacitors (FIG. 3 Phase 1 multiply) using a voltage to obtain a charge Q' which is not the information to be stored in memory, it is just part of the computation, as will be further explained. During Phase 2 accumulate, sum all the charges when discharging the capacitors. The memory/weight/information of the neural network is the capacitance itself. Advantageously, in the embodiments depicted in FIGS. 3 and 4, the capacitors only need to hold the charge long enough to carry out the C×V calculation. Once the information is read out, the capacitors do not need to further hold the charge. From a practical point of view, this means that the inter-plate dielectric can be quite thin and a certain amount of leakage can be tolerated. It is fairly easy to build relatively large-capacitance capacitors that do not need to hold the charge for too long.

Again, in certain prior art approaches, the information is the charge on capacitors, while in one or more embodiments, the information is the capacitance and the charge is just used to measure the capacitance. In FIG. 3, apply a voltage vector {V1, V2, . . . , VN} to the word lines (only the word lines corresponding to V1 and V2 are shown) and the indicated transistors 705 are ON and the capacitors are being charged. The amount of charge being put on each cap is the capacitance times the applied voltage. The charging process shown in FIG. 3 is the multiply part of the MAC. The voltage represents a number pertinent to a neural network calculation and the capacitance is the weight. Each capacitor has a different weight as part of a tuning process; i.e., in general, C11, C12, C21, and C22 have different capacitance values.

When the charging/multiplication of FIG. 3 is done, each cap holds a charge that is proportional to the capacitance times the voltage. V1 and V2 (indeed, each voltage in the voltage vector) are, in general, different voltages and each capacitance is different—it is the weight in the neural network that is set during tuning/training. Thus, the exemplary circuit has two phases/clocks. In the first phase of FIG. 3, carry out the multiplication; in the second phase of FIG. 4, carry out the accumulate (flip the states of the transistors and discharge the capacitors). The integrators 711 sum all the charges for a given bit line, to carry out the accumulate function. FIGS. 3 and 4 thus depict a MAC operation as part of an inference with the neural network (making predictions based on the existing weights). Further discussion will be provided below regarding how to set the capacitances of the capacitors (i.e., tune them) during the tuning or training phase.

Figure 6:
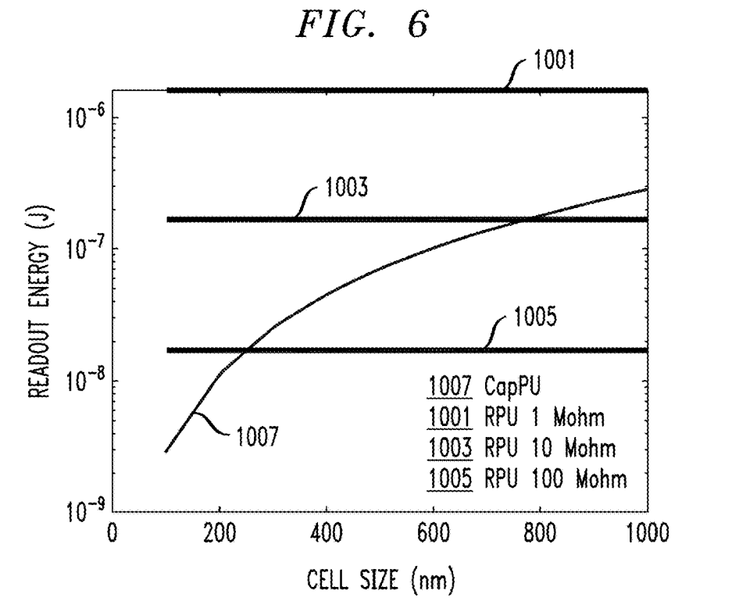
FIG. 6 compares readout energy for an exemplary embodiment to prior-art resistive approaches.

FIG. 6 shows energy dissipation (readout energy) in Joules versus the cell size in nm for the exemplary array of FIGS. 3 and 4, compared to three different resistive processing units (RPUs). Line 1001 shows the energy for a 1 Mohm RPU; line 1003 shows the energy for a 10 Mohm RPU; line 1005 shows the energy for a 100 Mohm RPU; and curve 1007 shows the energy for the exemplary array of FIGS. 3 and 4 ("CapPU"=capacitive processing unit). Ignoring parasitic resistance, the energy dissipation for the RPU is $v^2/r\_rpu * t * cells^2$; t is the integration time, assuming 100 ns; and v=1V. In contrast, for the capacitive processing unit (CapPU) array of FIGS. 3 and 4, the readout energy is given by $0.5 * c\_cell * v^2 * cells^2 * 2$, where c_cell is the FeFET capacitance/cell. As can be seen by FIG. 6, the CapPU can be more energy efficient than the RPU when performing a MAC.

In co-assigned U.S. Pat. No. 10,204,907, the memory elements are resistive elements; the current that flows is the voltage times the conductance G, by Ohm's law. By Kirchhoff's law a plurality of currents I1, I2, . . . flow. However, prior-art resistive elements dissipate power every time an operation is carried out. Advantageously, charging and discharging a capacitor per se, as in one or more embodiments, does not dissipate power. There are typically some parasitic losses in the wires/contacts but the element (capacitor) with which the computation is carried out does not dissipate power.

Figure 7:
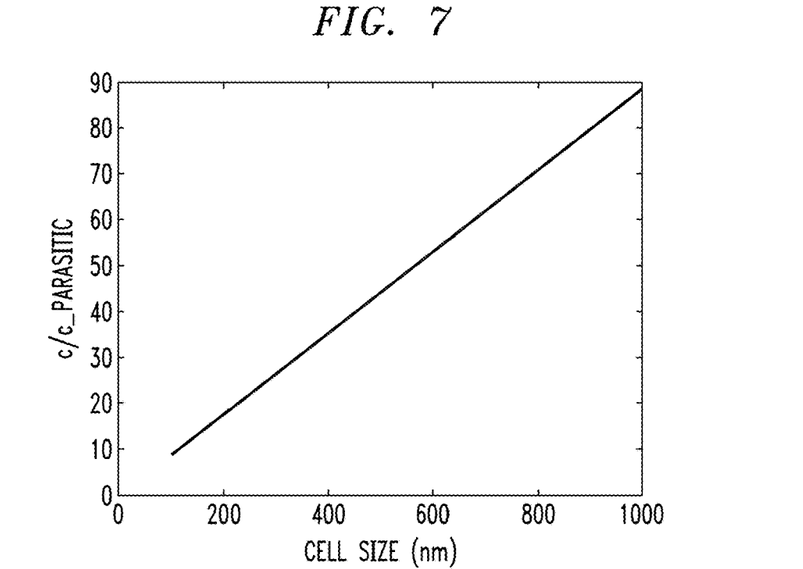
FIG. 7 presents a plot of design capacitance divided by parasitic capacitance, according to an aspect of the invention.

FIG. 7 shows capacitance ratio (cell capacitance C_cell over parasitic capacitance C_par=figure of merit (FOM)) versus the cell size in nm for the exemplary array of FIGS. 3 and 4, assuming the parasitic capacitance is 0.2 fF/μm; $C\_cell \propto $ cell size $^2$; and C_par ∝ cell size. Since the cell capacitance value stores the information, it needs to be significantly bigger than the parasitic capacitance so that the information does not get overwhelmed by the parasitic capacitance (since all cells typically have about the same parasitic capacitance). As seen in FIG. 7, the FOM goes down as the cell size gets smaller, but even at small cell size (<200 nm) the design capacitance is about 10 times the parasitic capacitance.

It will be appreciated that the MAC operation for neural network inferencing or filter implementation in the signal processing field is computationally intensive. A vector of voltages is entered and in "one shot" the answer for the MAC is obtained, independent of the size of the voltage vector (up to a point as discussed just below with respect to noise issues). In contrast, a conventional CPU would carry out computation on the order of $n^2$ where n is the number of voltages in the vector. Practically, since there is noise in the system, there are limits regarding how much can be accumulated at once before saturation. When there are too many voltages in the vector, the voltages become comparable to the noise in the system, and computation is not feasible.

Figure 8:
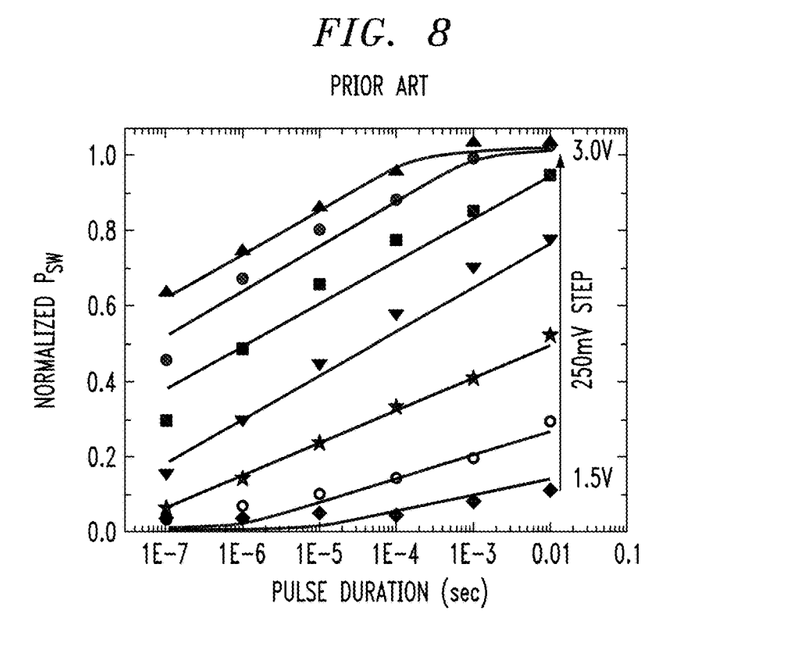
FIG. 8 shows prior-art techniques for adjusting capacitance values, that can be adapted to one or more embodiments of the invention.

A variety of non-volatile tunable capacitors can be used to implement one or more embodiments; e.g., the capacitance of an FeRAM can be used. Capacitors can include known metal-ferroelectric-metal (MFM) devices; for example, plate FeRAMs as discussed in Zheng, Qilin, et al., Artificial neural network based on doped $HfO_2$ ferroelectric capacitors with multilevel characteristics," IEEE Electron Device Letters, 2019 Jun. 10, 40(8):1309-12; trench FeRAMs as discussed in Florent, Karine, et al., First demonstration of vertically stacked ferroelectric Al doped $HfO_2$ devices for NAND applications, in 2017 Symposium on VLSI Technology 2017 Jun. 5 (pp. T158-T159), IEEE; or $HfO_2$-based ferroelectric FETs as discussed in Gong, Nanbo, and Tso-Ping Ma, A study of endurance issues in $HfO_2$-based ferroelectric field effect transistors: Charge trapping and trap generation. IEEE Electron Device Letters, 2017 Nov. 22, 39(1):15-8. Both program pulse amplitude and pulse width are able to tune the polarization in a ferroelectric film. Once polarization in the ferroelectric film is modified, the capacity to store charge (i.e., capacitance readout) is also adjusted. Referring to FIG. 8, consider, for simplicity, a polarization vs. pulse amplitude (width) to illustrate the possibility to change polarization of a ferroelectric film into different states. The same is discussed in Gong, Nanbo, et al., Nucleation limited switching (NLS) model for $HfO_2$-based metal-ferroelectric-metal (MFM) capacitors: Switching kinetics and retention characteristics, Applied Physics Letters, 2018 Jun. 25, 112(26):262903. Given the teachings herein, the skilled artisan can use, for example, conventional metal oxide semiconductor field effect transistor (MOSFET) fabrication techniques together with known techniques for fabricating ferroelectric devices, as discussed in this paragraph, to implement one or more embodiments. Given the teachings herein, the skilled artisan can apply appropriate voltage pulses with appropriate pulse width to the capacitors during training to set the appropriate weights.

Techniques of the present invention can provide substantial beneficial technical effects. For example, one or more embodiments provide:

ability to implement in-memory computing without need to use both NMOS and PMOS devices, thereby reducing fabrication complexity;

ability to implement in-memory computing with reduced power dissipation as compared to techniques that use conductance of an FeFET to store weights;

ability to employ capacitors having values throughout a wide capacitance range; for example, $HfO_2$ films from 1-40 nm, and/or operating speeds from 1 ns-100 µs;

ability to operate with many different types of capacitive structures including, for example, MFM plate, MFM trench, FeFET, and the like;

ability to operate with $HfO_2$-based ferroelectric devices including not only Al-doped $HfO_2$ based MFM structures, but also un-doped $HfO_2$, or doped $HfO_2$ with Si, Zr, N, and the like; and/or ability to be implemented with capacitors having interplate dielectrics that can be quite thin, because a certain amount of leakage can be tolerated.

Furthermore, one or more embodiments only use nMOS (or pMOS) as access devices, as well as applying the voltage vector from the voltage vector peripheral circuit 795 directly to the word lines 701 without the use of a multiplexer as in some prior art systems which require a multiplexer that includes a significant number of both nMOS and pMOS devices.

Given the discussion thus far, it will be appreciated that, in general terms, an exemplary electronic circuit, according to an aspect of the invention, includes a plurality of word lines 701-1, 701-2, . . . ; a plurality of bit lines 703-1, 703-2, . . . intersecting said plurality of word lines at a plurality of grid points; and a plurality of in-memory processing cells located at said plurality of grid points. Each of said in-memory processing cells includes a first switch 705 having a first terminal coupled to a corresponding one of said word lines and a second terminal; a second switch 707 having a first terminal coupled to said second terminal of said first switch and a second terminal coupled to a corresponding one of said bit lines; and a non-volatile tunable capacitor 709 having one electrode coupled to said second terminal of said first switch and said first terminal of said switch, and having another electrode coupled to ground.

As noted, the capacitor can be a parallel plate capacitor having two parallel plates; however, the capacitor does need to have a parallel plate geometry. Thus, the broader terminology "electrode" is adapted in lieu of "plate" to encompass the plates of parallel late capacitors and the corresponding structures in capacitors of alternative geometries.

As used herein, a non-volatile tunable capacitor is one which remembers its tuned capacitance once tuned.

In one or more embodiments, the circuit further includes a plurality of integrators 711 coupled to said plurality of bit lines.

In one or more embodiments, said first switch comprises a first field effect transistor; said second switch comprises a second field effect transistor of a same type (n or p) as said first field effect transistor; said first terminal of said first field effect transistor comprises a first drain-source terminal of said first field effect transistor; said second terminal of said first field effect transistor comprises a second drain-source terminal of said first field effect transistor; said first terminal of said second field effect transistor comprises a first drain-source terminal of said second field effect transistor; and said second terminal of said second field effect transistor comprises a second drain-source terminal of said second field effect transistor.

Note, however, that other suitable switches besides FETs can be employed; e.g., bipolar junction transistors (BJTs).

In one or more embodiments, said non-volatile tunable capacitor(s) comprise(s) metal-ferroelectric-metal capacitor(s).

One or more embodiments further include a voltage vector peripheral circuit 795; a voltage supply 799; and a control circuit 797. The voltage vector peripheral circuit 795, said voltage supply, and said control circuit are cooperatively configured to, in a multiply phase, close said first switches, open said second switches, and apply said voltage vector to said word lines, and, in an accumulate phase, open said first switches, and close said second switches to connect each of those capacitors associated with a given one of said bit lines to a corresponding one of said integrators.

In one or more embodiments, each of said non-volatile tunable capacitors has a separate capacitance value corresponding to a weight in a neural network. In general, weights of different synapses could be the same, but also could be different; in one or more embodiments, at least some of the weights are different from each other.

In one or more embodiments, each of said non-volatile tunable capacitors comprises a metal-ferroelectric-metal capacitor, and said voltage supply and said control circuit are further cooperatively configured to apply voltage pulses to said metal-ferroelectric-metal capacitors, during a training stage, to encode said weights therein.

Given the teachings herein, the skilled artisan can use known techniques to implement the voltage supply, control circuit, and peripheral circuit 795.

Another aspect includes an individual cell as described in connection with the array, i.e., an in-memory processing cell for interconnection with a word line 701-1, 701-2, . . . , a bit line 703-1, 703-2, . . . , and a ground terminal (not separately numbered, indicated by the ground symbol). The cell includes a first switch 705 having a first terminal for interconnection to the word line and a second terminal; a second switch 707 having a first terminal coupled to said second terminal of said first switch and a second terminal for interconnection to the bit line; and a non-volatile tunable capacitor 709 having one electrode coupled to said second terminal of said first switch and said first terminal of said switch, and having another electrode for interconnection to the ground terminal.

In one or more embodiments, said first switch comprises a first field effect transistor; said second switch comprises a second field effect transistor of a same type (n or p) as said first field effect transistor; said first terminal of said first field effect transistor comprises a first drain-source terminal of said first field effect transistor; said second terminal of said first field effect transistor comprises a second drain-source terminal of said first field effect transistor; said first terminal of said second field effect transistor comprises a first drain-source terminal of said second field effect transistor; and said second terminal of said second field effect transistor comprises a second drain-source terminal of said second field effect transistor.

In one or more embodiments, the non-volatile tunable capacitor comprises a metal-ferroelectric-metal capacitor.

In another aspect, an exemplary method includes (e.g., first phase of inference) charging a plurality of non-volatile tunable capacitors 709 in a plurality of cells by turning on a plurality of first switches 705 coupling first electrodes of said non-volatile tunable capacitors to a plurality of word lines 701-1, 701-2, . . . maintained at a plurality of voltages corresponding to a voltage vector (see 795); and (e.g., second phase of inference) subsequent to said charging, discharging said plurality of non-volatile tunable capacitors by turning on a plurality of second switches 707 coupling said first electrodes of said non-volatile tunable capacitors to a plurality of bit lines 703-1, 703-2, . . . . A further step includes, for each bit line of said plurality of bit lines, integrating a total charge of each of said plurality of non-volatile tunable capacitors associated with a given one of said bit lines with a corresponding plurality of integrators 711 coupled to said plurality of bit lines.

As discussed elsewhere herein, the integrated charge is used, for example, to represent weight of the synapse (similar to the purpose of channel conductance of an FeFET in prior arts.) Training and inference are based on the weights of synapses within the neural network, and training changes the weights. Inference is the operation to supply a prediction based on the weights.

One or more embodiments further include causing said plurality of second switches to be off during said charging; and causing said plurality of first switches to be off during said discharging; and/or grounding second electrodes of said non-volatile tunable capacitors.

One or more embodiments further include applying said plurality of voltages corresponding to said voltage vector to said plurality of word lines during said charging step.

One or more embodiments further include tuning each of said non-volatile tunable capacitors to a separate capacitance value, corresponding to a weight in a neural network, during a training stage. Refer to the above comments about the weights generally being different. One or more instances further include carrying out neural network inferencing based on said weights and said integrated charges.

In some instances, each of said non-volatile tunable capacitors comprises a metal-ferroelectric-metal capacitor, and the tuning comprises applying voltage pulses of appropriate pulse amplitude and pulse width to said metal-ferroelectric-metal capacitors, during said training stage, to encode said weights therein. FIG. 3 and FIG. 4 present "ON" and "OFF" states of the transistors suitable to program the "capacitor" and/or carry out the MAC operation. Given the teachings herein, the skilled artisan can implement techniques to turn switches 705, 707 on and off and configure the voltage supply and control circuit to apply the correct pulses during training.

In one or more embodiments, said first switch comprises a first field effect transistor; said second switch comprises a second field effect transistor of a same type as said first field effect transistor; said first terminal of said first field effect transistor comprises a first drain-source terminal of said first field effect transistor; said second terminal of said first field effect transistor comprises a second drain-source terminal of said first field effect transistor; said first terminal of said second field effect transistor comprises a first drain-source terminal of said second field effect transistor; said second terminal of said second field effect transistor comprises a second drain-source terminal of said second field effect transistor; and turning on said plurality of first and second switches comprises applying an activating gate-source voltage thereto.

Figure 9:
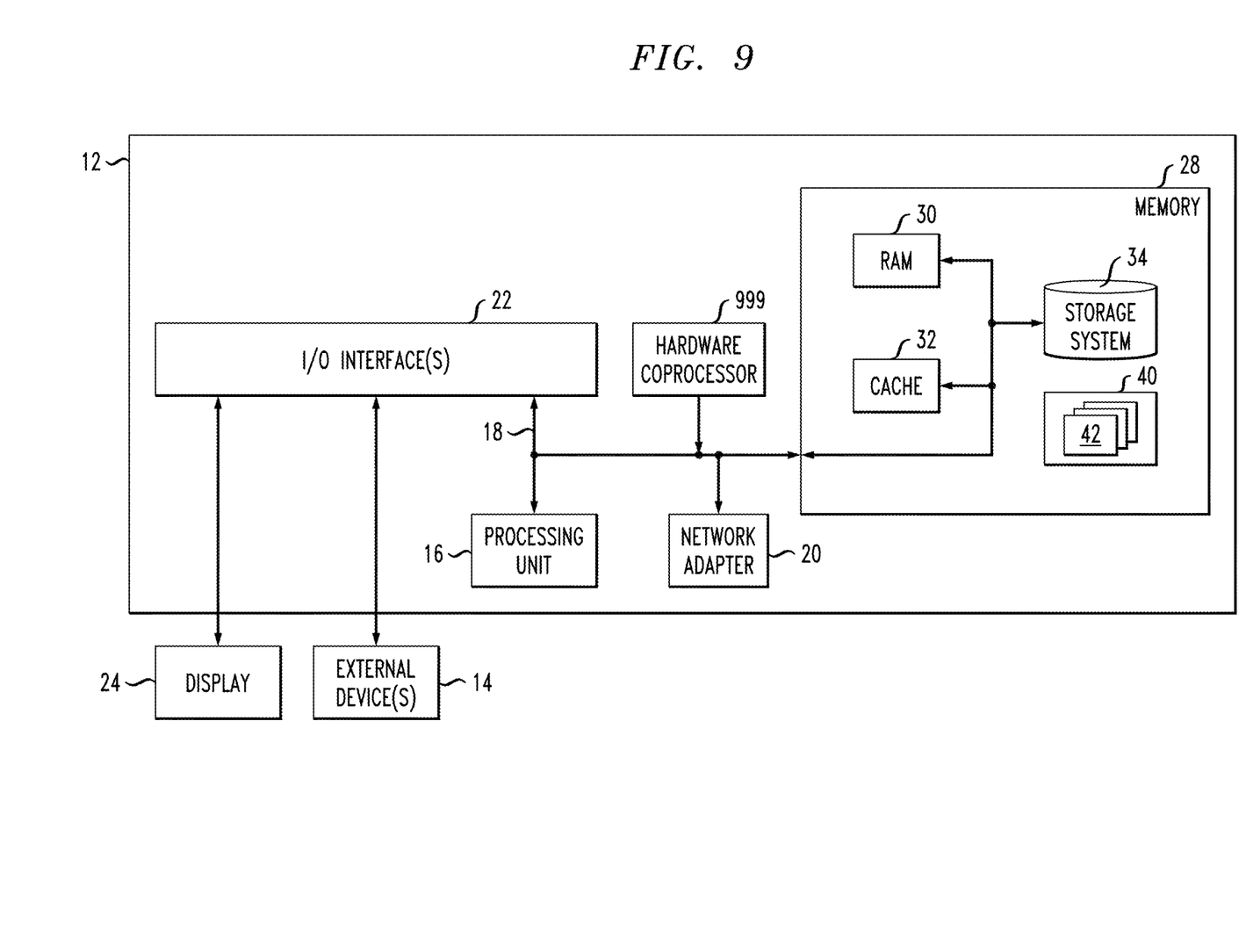

Referring to FIG. 9, some aspects of the invention can be implemented as a hardware coprocessor 999 that uses the specialized hardware techniques to accelerate matrix multiplication for neural networks, filter implementation, or the like. FIG. 9 depicts a computer system 12 including such a hardware coprocessor. Computer system 12 includes, for example, one or more conventional processors or processing units 16, a system memory 28, and a bus 18 that couples various system components including system memory 28 and one or more hardware coprocessors 999 to processor 16. The elements 999 and 16 can connect to the bus, for example, with suitable bus interface units.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below memory 28 may include at least one program product having a set (e.g., at least one) of program modules that are configured to carry out, e.g., software-implemented portions of a neural network or digital filter.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out software-implemented functions and/or methodologies.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Still with reference to FIG. 9, note processor 16, memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry (e.g., 999). Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, coprocessor 999, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing desired tasks, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit, comprising:
    a plurality of word lines;
    a plurality of bit lines intersecting said plurality of word lines at a plurality of grid points;
    a plurality of integrators coupled to said plurality of bit lines;
    a voltage vector peripheral circuit;
    a voltage supply;
    a control circuit; and
    a plurality of in-memory processing cells located at said plurality of grid points, each of said in-memory processing cells comprising:
        a first switch having a first terminal coupled to a corresponding one of said word lines and a second terminal;
        a second switch having a first terminal coupled to said second terminal of said first switch and a second terminal coupled to a corresponding one of said bit lines, wherein said first switch and said second switch both are field effect transistors of a same type that is selected from the list consisting of: NMOS and PMOS; and
        a non-volatile tunable capacitor having one electrode coupled to said second terminal of said first switch and said first terminal of said second switch, and having another electrode coupled to ground,
    wherein said voltage vector peripheral circuit, said voltage supply, and said control circuit are cooperatively configured to:
        in a multiply phase, close said first switches, open said second switches, and apply a voltage vector from said voltage vector peripheral circuit to said word lines; and
        in an accumulate phase, open said first switches, and close said second switches to connect, to a corresponding one of said integrators, each of said non-volatile tunable capacitors that is associated with a given one of said bit lines.

2. The electronic circuit of claim 1, wherein each of said non-volatile tunable capacitors has a separate capacitance value corresponding to a weight in a neural network.

3. The electronic circuit of claim 2, wherein each of said non-volatile tunable capacitors comprises a metal-ferroelectric-metal capacitor, and wherein said voltage supply and said control circuit are further cooperatively configured to apply voltage pulses to said metal-ferroelectric-metal capacitors, during a training stage, to encode said weights therein.

* * * * *